(12) United States Patent
North

(10) Patent No.: US 8,081,777 B2
(45) Date of Patent: Dec. 20, 2011

(54) VOLUME-BASED ADAPTIVE BIASING

(75) Inventor: Brian B. North, Los Gatos, CA (US)

(73) Assignee: Fairchild Semiconductor Corporation, San Jose, CA (US)

(*) Notice: Subject to any disclaimer, the term of this patent is extended or adjusted under 35 U.S.C. 154(b) by 1119 days.

(21) Appl. No.: 11/688,829

(22) Filed: Mar. 20, 2007

(65) Prior Publication Data

US 2007/0223738 A1    Sep. 27, 2007

Related U.S. Application Data

(60) Provisional application No. 60/784,638, filed on Mar. 21, 2006.

(51) Int. Cl.
*H03G 3/00* (2006.01)

(52) U.S. Cl. ........ 381/109; 381/104; 381/108; 330/127; 330/133; 330/134; 330/136

(58) Field of Classification Search .......... 381/28, 381/120, 123, 104–109, 111, 113; 330/199, 330/200, 127, 297, 251, 10, 302, 133–134, 330/136

See application file for complete search history.

(56) References Cited

U.S. PATENT DOCUMENTS

| | | |
|---|---|---|
| 4,030,045 A | 6/1977 | Clark |
| 4,324,950 A | 4/1982 | Strickland |
| 5,038,325 A | 8/1991 | Douglas et al. |
| 5,072,171 A | 12/1991 | Eng |
| 5,111,375 A | 5/1992 | Marshall |
| 5,115,203 A | 5/1992 | Krett et al. |
| 5,194,821 A | 3/1993 | Brambilla |
| 5,216,379 A * | 6/1993 | Hamley .................. 330/134 |
| 5,347,171 A | 9/1994 | Cordoba et al. |
| 5,387,876 A | 2/1995 | Sondermeyer |
| 5,442,317 A | 8/1995 | Stengel |
| 5,491,839 A | 2/1996 | Schotz |
| 5,694,072 A | 12/1997 | Hsiao |
| 6,028,486 A | 2/2000 | Andre |
| 6,107,886 A | 8/2000 | Kusakabe |

(Continued)

FOREIGN PATENT DOCUMENTS

EP        6215356        4/2001

(Continued)

OTHER PUBLICATIONS

"TDA7563 Multifunction Quad Power Amplifier with Built-In Diagnostics Features," May 2003. ST Microelectronics.
MAX9730 2.4W, Single-Supply, Class G Amplier, Dec. 2006, Maxim Integrated Products.
International Search Report PCT/US07/064546.

(Continued)

*Primary Examiner* — Devona Faulk
*Assistant Examiner* — Disler Paul
(74) *Attorney, Agent, or Firm* — Schwegman, Lundberg & Woessner, P.A.

(57) ABSTRACT

An audio amplifier such as for driving headphones. The amplifier includes multiple amplifier devices coupled in parallel. Both a bias generator and a volume control are responsive to a user setting. Under low output signal conditions, one or more of the amplifier devices are disabled in response to the user setting. Disabled amplifier devices do not consume output bias current. Thus the audio amplifier has reduced power consumption, and the system has longer battery life.

15 Claims, 3 Drawing Sheets

U.S. PATENT DOCUMENTS

| | | | |
|---|---|---|---|
| 6,184,726 B1 | 2/2001 | Haeberli et al. | |
| 6,215,356 B1 | 4/2001 | Servaes et al. | |
| 6,256,482 B1 | 7/2001 | Raab | |
| 6,278,332 B1 | 8/2001 | Nelson et al. | |
| 6,304,138 B1 | 10/2001 | Johnson | |
| 6,323,729 B1 | 11/2001 | Sevenhans et al. | |
| 6,369,661 B1 | 4/2002 | Scott et al. | |
| 6,373,340 B1 | 4/2002 | Shashoua | |
| 6,417,736 B1 | 7/2002 | Lewyn | |
| 6,486,733 B2 | 11/2002 | Myers et al. | |
| 6,504,426 B2 | 1/2003 | Picha et al. | |
| 6,538,514 B2 | 3/2003 | Harvey | |
| 6,552,607 B1 | 4/2003 | Danielson | |
| 6,583,674 B2 | 6/2003 | Melava et al. | |
| 6,614,310 B2 | 9/2003 | Quarfoot et al. | |
| 6,636,103 B2 | 10/2003 | Wurcer et al. | |
| 6,677,789 B1 | 1/2004 | Svard | |
| 6,763,470 B1* | 7/2004 | Bell et al. | 713/320 |
| 6,815,988 B2 | 11/2004 | Sanduleanu | |
| 6,838,942 B1 | 1/2005 | Somerville et al. | |
| 6,853,244 B2 | 2/2005 | Robinson et al. | |
| 6,917,245 B2 | 7/2005 | Dupuis et al. | |
| 6,975,175 B2 | 12/2005 | Sanduleanu | |
| 6,980,045 B1 | 12/2005 | Liu | |
| 6,982,600 B2 | 1/2006 | Harvey | |
| 6,987,417 B2 | 1/2006 | Winter et al. | |
| 6,993,302 B2 | 1/2006 | Bausov et al. | |
| 6,998,914 B2 | 2/2006 | Robinson | |
| 7,026,868 B2 | 4/2006 | Robinson et al. | |
| 7,034,614 B2 | 4/2006 | Robinson et al. | |
| 7,042,284 B2 | 5/2006 | Moons et al. | |
| 7,043,213 B2 | 5/2006 | Robinson et al. | |
| 7,106,135 B2 | 9/2006 | Makino et al. | |
| 7,183,844 B2 | 2/2007 | Klomsdorf et al. | |
| 7,202,734 B1 | 4/2007 | Raab | |
| 7,358,818 B2 | 4/2008 | Uesaka et al. | |
| 7,408,414 B2 | 8/2008 | North | |
| 7,498,880 B2 | 3/2009 | Delano | |
| 7,522,433 B2 | 4/2009 | Delano et al. | |
| 7,619,480 B2 | 11/2009 | North | |
| 7,649,415 B2 | 1/2010 | Delano | |
| 2002/0084853 A1* | 7/2002 | Finlay et al. | 330/288 |
| 2002/0140513 A1 | 10/2002 | Maneatis | |
| 2003/0138112 A1 | 7/2003 | Doy | |
| 2004/0189395 A1* | 9/2004 | Nagle et al. | 330/295 |
| 2005/0012554 A1 | 1/2005 | Somerville et al. | |
| 2007/0052482 A1* | 3/2007 | Kasha et al. | 330/302 |
| 2007/0236295 A1 | 10/2007 | Delano | |
| 2007/0285176 A1 | 12/2007 | North | |
| 2008/0019546 A1 | 1/2008 | Delano et al. | |
| 2008/0068079 A1 | 3/2008 | Delano | |
| 2008/0258811 A1 | 10/2008 | North et al. | |
| 2008/0315955 A1 | 12/2008 | Delano | |

FOREIGN PATENT DOCUMENTS

| | | |
|---|---|---|
| EP | 1120901 A1 | 8/2001 |
| JP | 63272208 A | 11/1988 |
| JP | 7240639 A | 9/1995 |
| JP | 8307223 A | 11/1996 |
| JP | 10173444 A | 6/1998 |
| JP | 11284450 A | 10/1999 |
| JP | 2000183673 A | 6/2000 |
| JP | 2002345078 A | 8/2002 |
| JP | 2002345064 A | 11/2002 |
| JP | 2004282159 A | 10/2004 |
| JP | 2004355713 A | 12/2004 |
| JP | 2004357704 A | 12/2004 |
| WO | WO 97/23005 A1 | 6/1997 |
| WO | WO 00/00983 A1 | 1/2000 |
| WO | WO-2007109738 A2 | 9/2007 |
| WO | WO-2007109738 A3 | 9/2007 |
| WO | WO-2007130750 A2 | 11/2007 |
| WO | WO-2007130750 A3 | 11/2007 |
| WO | WO-2007136919 A2 | 11/2007 |
| WO | WO-2007136919 A3 | 11/2007 |
| WO | WO-2007136920 A2 | 11/2007 |
| WO | WO-2007136920 A3 | 11/2007 |

OTHER PUBLICATIONS

International Search Report PCT/US07/064549.
International Search Report PCT/US07/064548.
International Search Report PCT/US07/064545.
International Search Report PCT/US07/064543.
"European Application Serial No: 07811829.6, Office Action Response filed Jul. 15, 2010", 24 pgs.
"International Application Serial No. PCT/US2007/064545, International Preliminary Report on Patentability mailed Sep. 23, 2008", 6 pgs.
"International Application Serial No. PCT/US2007/064545, Written Opinion mailed Feb. 28, 2008", 5 pgs.
"International Application Serial No. PCT/US2007/064546, International Preliminary Report on Patentability mailed May 15, 2008", 6 pgs.
"International Application Serial No. PCT/US2007/064546, Written Opinion mailed Feb. 28, 2008", 4 pgs.
"International Application Serial No. PCT/US2007/064548, International Preliminary Report on Patentability mailed Sep. 23, 2008", 8 pgs.
"International Application Serial No. PCT/US2007/064548, Written Opinion mailed Mar. 19, 2008", 7 pgs.
"International Application Serial No. PCT/US2007/064549, Written Opinion mailed Feb. 22, 2008", 4 pgs.
"U.S. Appl. No. 11/688,816, Non Final Office Action mailed Oct. 6, 2008", 6 pgs.
"U.S. Appl. No. 11/688,822, Non Final Office Action mailed Nov. 19, 2007", 8 pgs.
"U.S. Appl. No. 11/688,822, Notice of Allowance mailed Apr. 3, 2008", 6 pgs.
"U.S. Appl. No. 11/688,822, Preliminary Amendment filed Jul. 17, 2007", 3 pgs.
"U.S. Appl. No. 11/688,822, Response filed Dec. 12, 2007 to Non Final Office Action mailed Nov. 19, 2007", 5 pgs.
"U.S. Appl. No. 11/688,826, Non Final Office Action mailed Sep. 10, 2008", 8 pgs.
"U.S. Appl. No. 11/688,826, Preliminary Amendment filed Jul. 17, 2007", 3 pgs.
"U.S. Appl. No. 11/688,835, Notice of Allowance mailed Dec. 30, 2008", 8 pgs.
"U.S. Appl. No. 11/688,833, Non Final Office Action mailed Jan. 14, 2008", 6 pgs.
"U.S. Appl. No. 11/688,833, Notice of Allowance mailed Jun. 2, 2008", 7 pgs.
"U.S. Appl. No. 11/688,833, Response filed Apr. 21, 2008 to Non Final Office Action mailed Jan. 14, 2008", 10 pgs.
"U.S. Appl. No. 12/128,092, Non Final Office Action mailed Oct. 1, 2008", 6 pgs.
"U.S. Appl. No. 12/128,092, Notice of Allowance mailed Jul. 2, 2009", 6 pgs.
"U.S. Appl. No. 12/128,092, Response filed Mar. 23, 2009 to Non Final Office Action mailed Oct. 1, 2008", 6 pgs.
"U.S. Appl. No. 12/200,794, Notice of Allowance mailed Sep. 1, 2009", 8 pgs.
"U.S. Appl. No. 12/200,794, Preliminary Amendment filed Aug. 28, 2008", 7 pgs.
"European Application Serial No. 07759038.8, Extended European Search Report Received mailed Nov. 6, 2009", 3 pgs.
"European Application Serial No. 07811828.8, Extended European Search Report Mailed on Nov. 3, 2009", 9 pgs.
"European Application Serial No. 07811829.6, Extended European Search Report Received mailed Nov. 5, 2009", 5 pgs.
"European Application Serial No. 07811829.6, Office Action Received mailed Feb. 12, 2010", 1 pgs.
"U.S. Appl. No. 11/688,830, Non Final Office Action mailed Feb. 11, 2010", 18 pgs.
"U.S. Appl. No. 11/688,830, Response filed May 20, 2011 to Non Final Office Action mailed Feb. 22, 2011", 14 pgs.

"Japanese Application Serial No. 2009-501719, Office Action mailed May 10, 2011", 9 pgs.

"Japanese Application Serial No. 2009-501721, Office Action mailed Jun. 7, 2011", 7 pgs.

"Japanese Application Serial No. 2009-501720, Office Action mailed May 10, 2011", 11 pgs.

* cited by examiner

Fig. 1 – prior art

VOLUME-BASED ADAPTIVE BIASING

RELATED APPLICATION

The present application claims benefit under 35 USC 119(e) of U.S. provisional Application No. 60/784,638, filed on Mar. 21, 2006, entitled "Adaptive Biasing Based on Volume Control Setting," the content of which is incorporated herein by reference in its entirety.

BACKGROUND OF THE INVENTION

1. Technical Field of the Invention

This invention relates generally to audio amplifiers, and more specifically to amplifier biasing and volume control.

2. Background Art

Amplifiers are typically biased at a minimum bias level, in order to ensure good fidelity, low distortion, and so forth. In general, the most difficult case in which to achieve good fidelity is at the amplifier's maximum output level. Therefore, amplifier systems have traditionally had their bias set at a level such that the fidelity and performance are adequate at large signal operation.

At lower output level settings, this high bias level is typically far more than is necessary. This, unfortunately, results in an unnecessary and wasteful increase in power consumption when operating at small signal levels. This is especially unfortunate, given that most amplifiers are only rarely operated near their maximum output setting.

In general, it is desirable to minimize the power consumption of an amplifier circuit, particularly in battery-powered systems. It is also desirable to minimize the heat generated by the amplifier, to reduce costs associated with heatsinks, fans, and power supply components.

For a well-designed system which includes an output amplifier, the maximum output swing corresponds to the highest volume/level setting. Thus, the volume control setting and the output swing are related. In most systems, the volume control is implemented just before or as part of the power amplifier, or final stage in an amplifier chain, in order to maximize the dynamic range available to the preceding stages. In most systems, the maximum input level to the input of the volume control is known, and the peaks of the signal are generally made close to this limit, to maximize the signal-to-noise ratio of the preceding stages. Hence, it is possible to calculate the maximum possible output for each possible volume control setting.

FIG. 1 illustrates an exemplary audio system 10 according to the prior art. The audio system includes a multi-stage amplifier which includes a first stage (Amp Stage 1) which receives the audio input signal (often referred to as the "Voice Signal" regardless of its content), one or more intermediate amplifier stages (Amp Stage 2), and a final power amplifier stage (Amp Stage 3). The power amplifier is coupled to drive a headphone or loudspeaker transducer (LS). The power amplifier (or other stages) may include a feedback loop. The power amplifier has a power reference input coupled to the output of a bias generator. It is this bias generator whose bias level is set at a predetermined level, typically set to optimize fidelity and performance at the maximum possible output level of the power amplifier. The gain of the power amplifier is set by a volume control mechanism. Typically, the volume control mechanism is dynamically adjustable according to a setting established by a user.

What is needed is an improved audio amplifier system in which the gain established by the bias generator is dynamically adjustable, rather than being set at some predetermined point. Having a dynamically adjustable bias will enable the amplifier system to minimize power consumption and improve fidelity across a wide range of input signal levels and volume control settings.

DETAILED DESCRIPTION

The invention will be understood more fully from the detailed description given below and from the accompanying drawings of embodiments of the invention which, however, should not be taken to limit the invention to the specific embodiments described, but are for explanation and understanding only.

Figure 1:
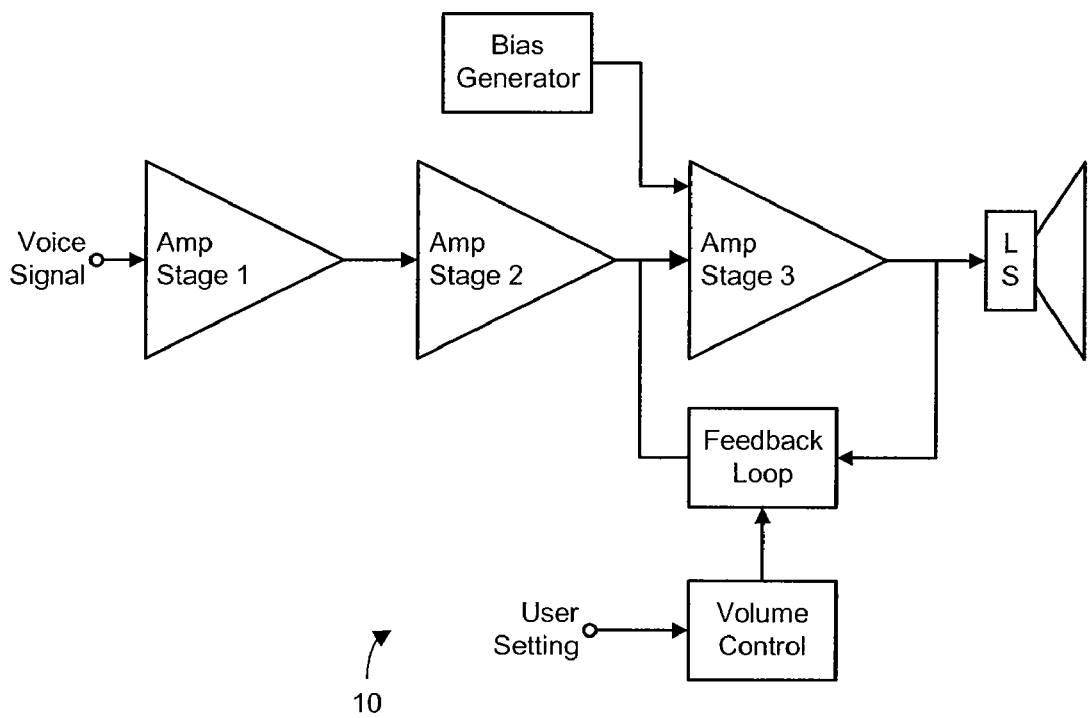
FIG. 1 shows an audio amplifier system according to the prior art.
Figure 2:
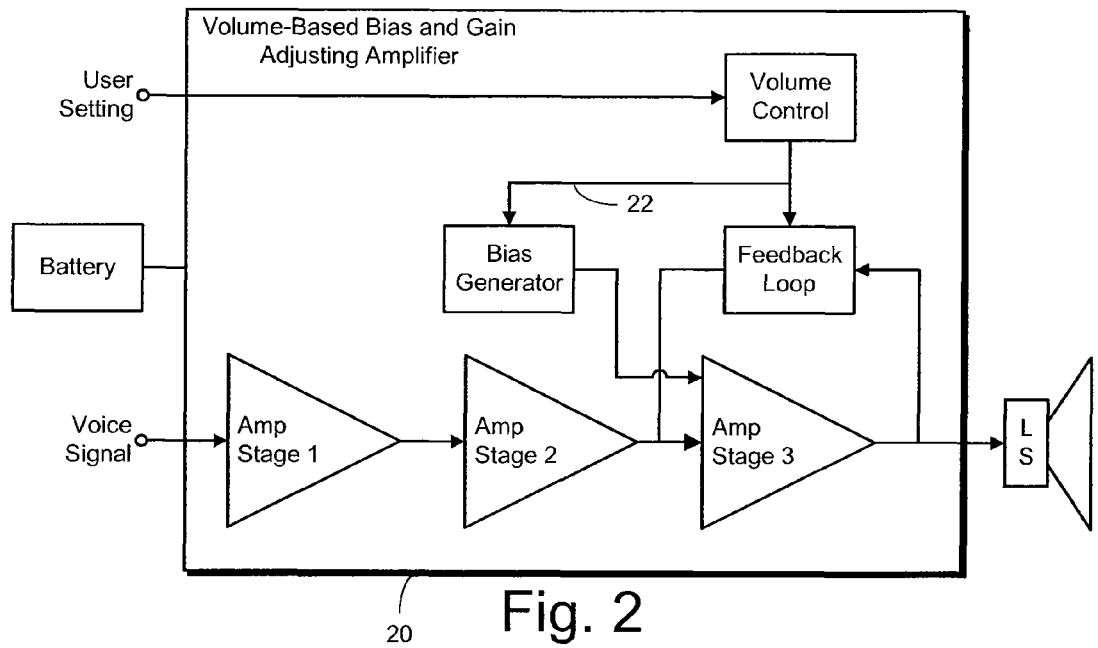
FIG. 2 shows an audio amplifier system according to one embodiment of this invention, in which the user-settable volume mechanism controls both (i) the bias generator to save power and (ii) the amplifier's feedback loop to adjust the amplifier gain.

FIG. 2 illustrates one embodiment of an audio amplifier system 20 according to this invention. The system includes an amplifier, which may optionally be a multi-stage amplifier chain. The amplifier stage(s) may optionally be equipped with feedback loop(s). The feedback loop of at least one stage of the amplifier, preferably the final power amplifier stage, is coupled to receive a signal 22 or other indicator from the volume control mechanism. This signal dynamically adjusts the feedback loop, to set the gain of the amplifier. This signal also dynamically adjusts the bias setting of the bias generator, to set the bias provided to the amplifier stage(s).

The bias generator (or, alternatively, the volume control mechanism) monitors and derives a control value from the volume control setting. The bias generator modifies the quiescent bias currents provided to the amplifier, to satisfy only the maximum signal level possible at the current volume control setting. In this manner, the bias current and hence the power consumption of the system can be reduced as the volume setting is reduced. Audio systems are rarely used at their maximum volume setting, and using this technique will reduce power consumption during most operating conditions.

The amplifier system is coupled to be powered by a power source which, in many embodiments, may be a battery. The output of the amplifier system is coupled to drive a transducer such as a headphone or loudspeaker.

Figure 3:
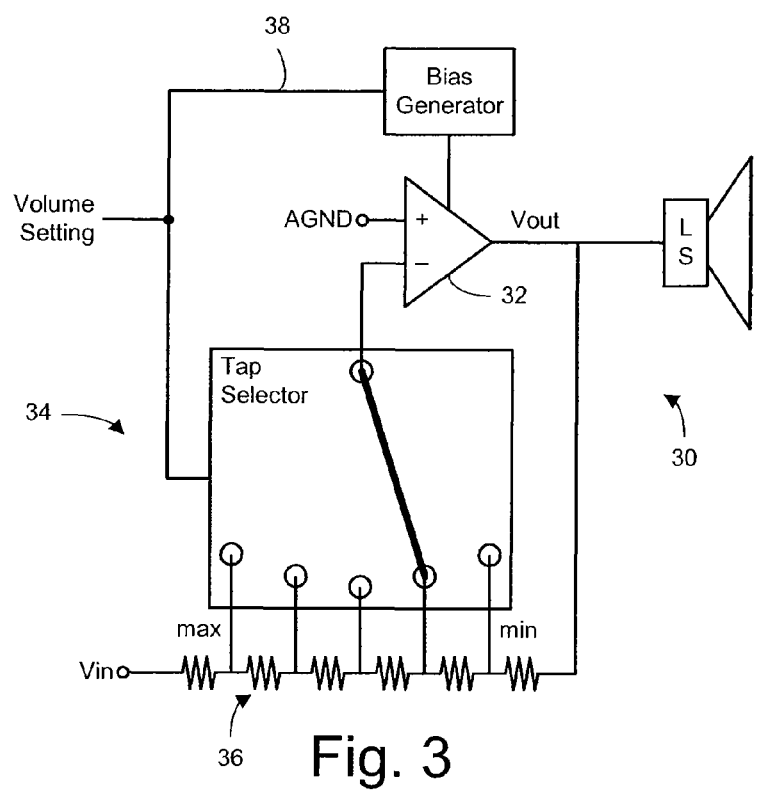
FIG. 3 shows an implementation of the audio amplifier system of FIG. 2.

FIG. 3 illustrates one embodiment of an audio amplifier system 30 similar to that of FIG. 2. The amplifier system includes an output amplifier 32 with a combined feedback loop and volume control mechanism 34, implemented as a tap selector and a resistor chain 36 between the output node and the input node. The volume is set by selecting a suitable point (tap) along the resistor chain for the feedback point of the amplifier. Selecting a tap closest to the output will provide the minimum gain and thus the lowest volume setting. Selecting a tap closest to the input will provide the maximum gain and thus the highest volume setting. The tap selector is typically implemented as an array of switches (not shown) controlled by a digital word (Volume Setting). The same digital Volume Setting word can be used to control the bias of the amplifier, as previously described, via a connection 38 to the bias generator.

Figure 4:
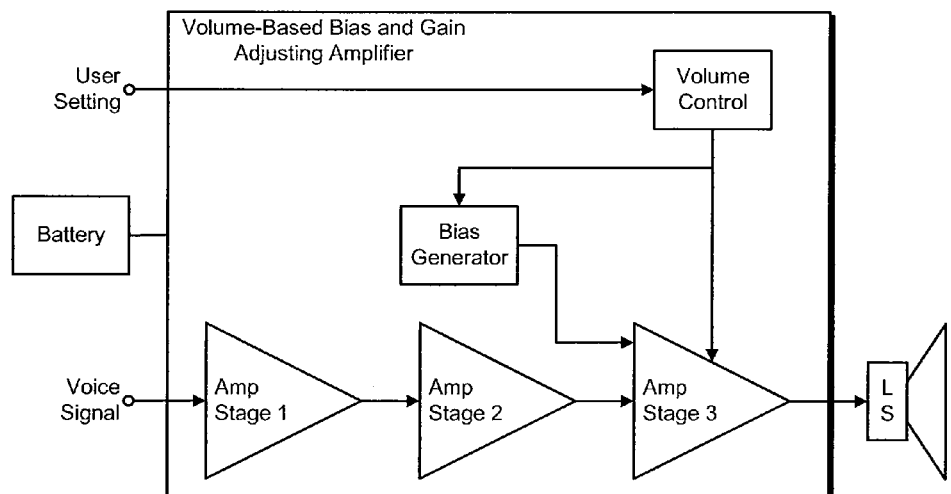
FIG. 4 shows an audio amplifier system according to another embodiment of this invention, in which the user-settable volume mechanism controls both (i) the bias generator to save power and (ii) the amplifier's effective multiplier number or "size" to adjust the amplifier gain.

FIG. 4 illustrates an audio amplifier system 40 according to another embodiment of this invention. In this embodiment, the user-settable volume control mechanism is coupled to adjust the bias produced by the bias generator, and to directly adjust the amplifier rather than a feedback loop of the amplifier. The volume control mechanism controls the gain of the amplifier by altering the effective multiplier number or "size" of the amplifier.

Figure 5:
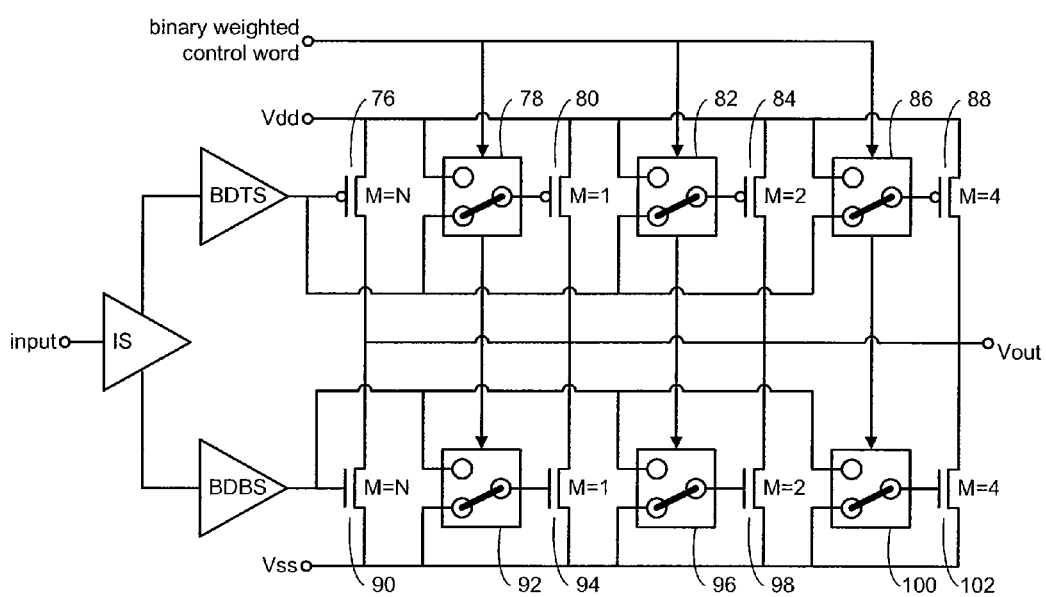
FIG. 5 shows an implementation of the audio amplifier system of FIG. 4.

FIG. 5 illustrates one embodiment of an audio amplifier circuit 70 similar to that of FIG. 4. The circuit includes an input stage (IS) which receives a signal from an input terminal, and provides gain and complementary output signals to a bias and driver top side circuit (BDTS) and to a bias and driver bottom side circuit (BDBS). The BDTS receives the output from the input stage and provides an output signal that is capable of driving and suitably biasing the relatively large output devices connected to the Vdd rail. The BDBS accepts another output from the input stage and provides an output signal that is capable of driving and suitably biasing the relatively large output devices connected to the Vss rail.

One suitable way to implement the output stage of the amplifier is to configure the output stage as multiple parallel devices which can be independently or sequentially powered down as the volume setting is reduced. In this manner, the output bias current, which flows between output devices 76 and 90, and between output devices 80 and 94, and between output devices 84 and 98, etc., can be reduced as the output swing requirements are reduced. Since the output bias current is generally a dominant component of the overall power consumption, large power savings can be made.

The circuit includes a plurality of parallel output stages 76, 90, 80, 94, 84, 98, 88, and 102, coupled in parallel to drive the output node Vout. The number, size, and/or power handling capacities of the various output stages can be selected according to the needs of the application at hand, and particularly in view of an anticipated volume setting usage model. In the example shown, the first output stage comprising devices 76 and 90 has a multiplier (M) value of N and is always active and directly coupled to the output. N can be any value suitable to create a minimum bias current that performs correctly for the minimum signal level with all other amplifier devices switched off. In some applications, N will be greater than 1. The values N, 1, 2, 4, etc. are for illustration only; in practice, the values do not need to be integer multiples.

A second output stage comprising devices 80 and 94 has a multiplier value of 1 and is coupled to be enabled and disabled by switches 78 and 92. A third output stage comprising devices 84 and 98 has a multiplier value of 2 and is coupled to be enabled and disabled by switches 82 and 96. A fourth output stage comprising devices 88 and 102 has a multiplier value of 4 and is coupled to be enabled and disabled by switches 86 and 100.

The switches are controlled by a binary weighted control word which may, in some embodiments, also be used to set a digitally controlled volume control (not shown). The binary weighted control word may be derived from the same digital signal that is used as an input to the digital volume control (not shown).

Amplifier output stages having a larger multiplier number (M) are able to drive larger output voltage swings into the loudspeaker load, but the output bias currents also increase by a factor of the multiplier M. By allowing the effective aggregate size of the amplifier output stage, and hence the overall output stage biasing current, to be adjusted by the volume control, the amplifier can be better optimized to match the output signal swing conditions while saving power.

CONCLUSION

When one component is said to be "adjacent" another component, it should not be interpreted to mean that there is absolutely nothing between the two components, only that they are in the order indicated.

The various features illustrated in the figures may be combined in many ways, and should not be interpreted as though limited to the specific embodiments in which they were explained and shown.

Those skilled in the art, having the benefit of this disclosure, will appreciate that many other variations from the foregoing description and drawings may be made within the scope of the present invention. Indeed, the invention is not limited to the details described above. Rather, it is the following claims including any amendments thereto that define the scope of the invention.

What is claimed is:

1. An audio amplifier for driving a transducer, the audio amplifier comprising:
    an amplifier having an input for receiving a voice signal and having an output couplable to drive the transducer, the amplifier having an adjustable gain;
    a bias generator coupled to provide a bias reference control to the amplifier; and
    a volume control mechanism having a user-settable input, and having an output coupled to adjust both the bias reference control provided by the bias generator and the gain of the amplifier; and
    wherein the volume control mechanism is configured to adjust the bias reference control to reduce current consumption based on a maximum swing of the voice signal at the amplifier output with respect to the user-settable input.

2. The audio amplifier of claim 1 wherein:
    the amplifier includes a feedback loop; and
    the volume control mechanism adjusts the gain of the amplifier by configuring the feedback loop.

3. The audio amplifier of claim 2 wherein:
    the feedback loop includes,
        a resistor chain coupled between the input of the amplifier and the output of the amplifier, and
        a tap selector coupled to the resistor chain at at least two points; and
    the volume control mechanism controls the feedback loop by operating the tap selector.

4. The audio amplifier of claim 1 wherein:
    the amplifier includes,
        a plurality of amplifier devices coupled in parallel, and
        at least one switch, each coupled to enable and disable a respective one of the plurality of amplifier devices in response to the volume control signal; and
    the volume control mechanism adjusts the gain of the amplifier by controlling the at least one switch.

5. The audio amplifier of claim 4 wherein the at least one switch comprises:
    a plurality of switches each coupled to enable and disable a respective one of the amplifier devices in response to the volume control signal.

6. The audio amplifier of claim 4 wherein:
each respective one of the amplifier devices has an independent multiplier value; and
the volume control signal comprises a binary weighted control word, wherein the binary weighted control word is weighted according to the multiplied values of the various amplifier devices.

7. The audio amplifier of claim 1 coupled to operate on battery.

8. An amplifier circuit for receiving an input signal and a gain setting signal and for generating an amplified output signal, the amplifier circuit comprising:
(A) a bias generator coupled to be responsive to the gain setting signal;
(B) an amplifier device having,
  (i) a signal input,
  (ii) an output, and
  (iii) a bias input coupled to an output of the bias generator;
(C) a resistor chain having,
  (i) a first end coupled to receive the input signal, and
  (ii) a second end coupled to the output of the amplifier device; and
(D) a multi-tap selector having,
  (i) an output coupled to the signal input of the amplifier device,
  (ii) a plurality of input taps coupled to respective points in the resistor chain, and
  (iii) a control input coupled to receive the gain setting signal, wherein the multi-tap selector is responsive to the gain setting signal to selectively couple one of the input taps to the output tap.

9. The amplifier circuit of claim 8 wherein the amplifier circuit is configured as an audio amplifier, the input signal comprises a voice signal, the gain setting signal comprises a volume setting signal, and the amplified output signal is adapted for driving an electroacoustic transducer.

10. An amplifier circuit for receiving an input signal and a user-adjustable gain setting signal and for generating an amplified output signal, the amplifier circuit comprising:
(A) an amplifier stage having,
  (i) a plurality of independently operable switches, and
  (ii) a plurality of amplifier devices each having an input coupled to receive the input signal and an output coupled to contribute to the amplified output signal, and each coupled to be controlled by a respective one of the switches;
(B) a bias generator coupled to provide a bias reference to the amplifier stage; and
(C) means for controlling the bias generator to adjust the bias reference, and for operating the switches to adjust a gain of the amplifier stage, with respect to the user-adjustable gain setting signal; and
wherein the bias generator is configured to respond to the user-adjustable gain setting and adjust the bias reference control to reduce current consumption based on a maximum output swing of the amplified output signal.

11. The amplifier circuit of claim 10 wherein the amplifier circuit is configured as an audio amplifier, the input signal comprises a voice signal, the gain setting signal comprises a volume setting signal, and the amplified output signal is adapted for driving an electroacoustic transducer.

12. A method of amplifying an audio signal by an audio amplifier, the method comprising:
receiving, at an input of the audio amplifier, the audio signal;
receiving a volume setting signal;
in response to the volume setting signal,
  adjusting a gain using a feedback loop of the amplifier and the volume setting signal;
  selecting a bias current related to a maximum output signal swing of the audio signal associated with the gain, the selected bias current configured to provide
  reducing current consumption based on a maximum output swing with respect to the volume setting signal, and
  controlling an amplifier stage, using the audio amplifier, to adjust a gain provided by the amplifier stage; and
amplifying, using the audio amplifier, the voice signal in response to the bias reference and the gain.

13. The method of claim 12 further comprising:
in response to the volume setting signal, coupling a selectable portion of a resistor chain into a feedback loop of the amplifier stage.

14. The method of claim 12 further comprising:
in response to the volume setting signal, selectively disabling at least one amplifier device in the amplifier stage.

15. The method of claim 14 wherein:
the volume setting signal comprises a binary weighted control word;
the audio amplifier includes a plurality of amplifier devices coupled in parallel, each respective amplifier device when enabled receiving and amplifying the audio signal according to a multiplier value of the amplifier device;
the binary weighted control word disabling and enabling respective ones of the amplifier devices according to a present value of the binary weighted control word;
whereby at least one of the amplifier devices may be disabled, thereby avoiding consumption of output bias current for the disabled amplifier device(s).

* * * * *